United States Patent
Iwanabe et al.

(10) Patent No.: US 10,330,716 B2
(45) Date of Patent: Jun. 25, 2019

(54) EARTH FAULT DETECTOR WITH FLYING CAPACITOR

(71) Applicant: Yazaki Corporation, Tokyo (JP)

(72) Inventors: Takeshi Iwanabe, Makinohara (JP); Ryosuke Arigaya, Makinohara (JP); Yoshihiro Kawamura, Makinohara (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 15/841,955

(22) Filed: Dec. 14, 2017

(65) Prior Publication Data
US 2018/0224494 A1    Aug. 9, 2018

(30) Foreign Application Priority Data

Feb. 7, 2017  (JP) .................................. 2017-020600
Jul. 6, 2017   (JP) .................................. 2017-132618

(51) Int. Cl.
*G01R 31/00* (2006.01)
*G01R 31/02* (2006.01)

(52) U.S. Cl.
CPC ......... *G01R 31/025* (2013.01); *G01R 31/006* (2013.01); *G01R 31/028* (2013.01)

(58) Field of Classification Search
CPC ... G01R 31/025; G01R 31/028; G01R 31/006
USPC ......................................... 324/509, 658–690
See application file for complete search history.

(56) References Cited

U.S. PATENT DOCUMENTS

2009/0289640 A1* 11/2009 Kawamura .......... G01R 27/025
                                                    324/658

FOREIGN PATENT DOCUMENTS

JP          2009-281986 A    12/2009

* cited by examiner

*Primary Examiner* — Farhana A Hoque
(74) *Attorney, Agent, or Firm* — Sughrue Mion, PLLC

(57) ABSTRACT

An earth fault detector has a controller, a capacitor, a positive side power line connected to a positive side of the high voltage battery, a negative side power line a negative side thereof, a positive second side resistance, a negative second side resistance, a positive side C contact switch, and a negative side C contact switch. The positive side C contact switch switches a connection destination of a first end of the detection capacitor to either a path including the positive side power line or a path including the positive second side resistance. The negative side C contact switch switches a connection destination of a second end of the detection capacitor to either a path including the negative side power line or a path including the negative second side resistance. The controller controls switching of a first and second measurement modes.

6 Claims, 13 Drawing Sheets

MEASUREMENT MODE A

MEASUREMENT MODE B

MEASUREMENT MODE C

MEASUREMENT MODE D

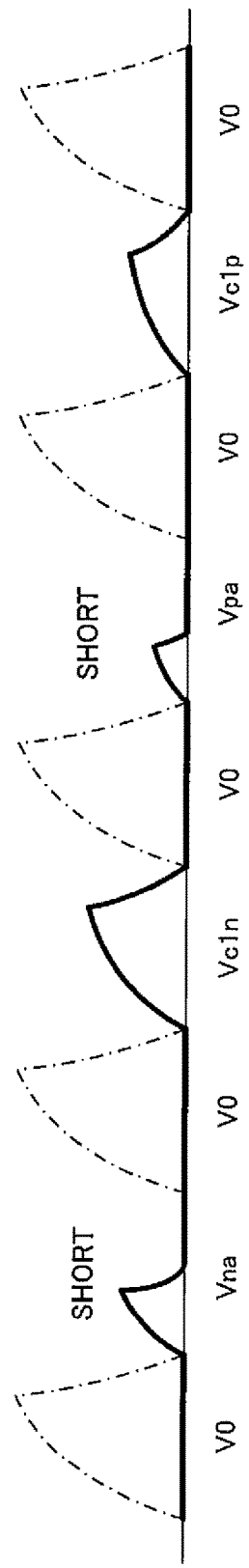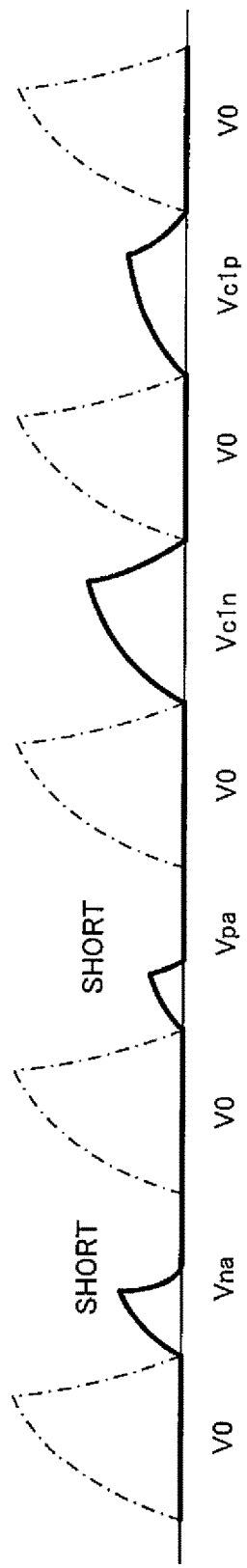

EARTH FAULT DETECTOR WITH FLYING CAPACITOR

The present invention relates to an earth fault detector using a flying capacitor.

BACKGROUND OF THE INVENTION

Technical Field

A vehicle such as a hybrid vehicle having an engine and an electric motor as a driving source or an electric vehicle charges a battery mounted in a vehicle body, and generates driving force by using an electric energy from the battery. In general, a battery-associated power circuit is configured as a high-voltage circuit for handling high-voltage of 200 V or more. Further, in order to ensure safety, the high-voltage circuit including the battery is ungrounded structure electrically insulated from the vehicle body which is the ground reference potential point.

In the vehicle mounting an ungrounded high-voltage battery, an earth fault detector is provided so as to monitor a system in which the high-voltage battery is arranged, more specifically, an insulated condition (ground fault) between a main power system from the high-voltage battery to a motor and the vehicle body. In the earth fault detector, a system using a capacitor called as a flying capacitor is widely used.

FIG. 11 is a view showing a circuit example of a conventional earth fault detector of a flying capacitor system. As show in FIG. 11, an earth fault detector 400 is connected to an ungrounded high voltage battery 300, and is a device for detecting an earth fault of a system having the high voltage battery 300. Herein, an insulation resistance between a positive side of the high voltage battery 300 and a ground is indicated as RLp, an insulation resistance between a negative side thereof and the ground is indicated as RLn.

As shown in FIG. 11, the earth fault detector 400 includes a detection capacitor C1 operating as a flying capacitor. Further, the earth fault detector 400 includes four switching elements S1 to S4 around the detection capacitor C1 so as to switch measurement paths and to control charge and discharge of the detection capacitor C1. Furthermore, it includes a switching element Sa so as to sampling a measurement voltage corresponding to a charge voltage of the detection capacitor C1.

In the earth fault detector 400, a measurement operation of V0 measurement period→Vc1n measurement period→V0 measurement period→Vc1p measurement period as one cycle is repeated. In those periods, the detection capacitor C1 is charged with a voltage of a measurement target, and then a charge voltage of the detection capacitor C1 is measured. Also, in order to perform a next measurement, the detection capacitor C1 is discharged.

In the V0 measurement period, a voltage corresponding to a voltage of the high voltage battery is measured. For this reason, the switching elements S1 and S2 are turned ON, the switching elements S3 and S4 are turned OFF, and thereby the detection capacitor X1 is charged. That is, as shown in FIG. 12A, the high voltage battery 300, a resistance R1, and the detection capacitor C1 become a measurement path.

When measuring the charge voltage of the detection capacitor C1, as shown in FIG. 12B, the switching elements S1 and S2 are turned OFF, the switching elements S3 and S4 are turned ON, and the sampling is performed in the controller 420 while the switching element Sa is turned ON. Thereafter, as shown in FIG. 12C, the switching element Sa is turned OFF, and then the detection capacitor C1 is discharged so as to perform next measurement. When measuring the charge voltage of the detection capacitor C1, an operation when discharging the detection capacitor C1 is the same that in the other measurement periods.

In the Vc1n measurement period, a voltage reflecting the effect of the insulation resistance RLn is measured. Therefore, the switching elements S1 and S4 are turned ON, the switching elements S2 and S3 are turned OFF, and the detection capacitor C1 is charged. That is, as shown in FIG. 13A, a path including the high voltage battery 300, the resistance R1, the detection capacitor C1, the resistance R4, the ground, and the insulation resistance RLn become a measurement path.

In the Vc1p measurement period, a voltage reflecting the effect of the insulation resistance RLp is measured. Therefore, the switching elements S2 and S3 are turned ON, the switching elements S1 and S4 are turned OFF, and the detection capacitor C1 is charged. That is, as shown in FIG. 13B, a path including the high voltage battery 300, the insulation resistance RLp, the ground, the resistance R3, the resistance R1, and the detection capacitor C1 become a measurement path.

It is known that $(RLp \times RLn)/(RLp+RLn)$ can be obtained based on $(Vc1p+Vc1n)/V0$ calculated from V0, Vc, Vc1n, and Vc1p obtained in those measurement periods. For this reason, the controller 420 in the earth fault detector 400 can get the insulation resistances RLp and RLn by measuring V0, Vc1n, and Vc1p. Further, when the insulation resistances RLp and RLn becomes equal to or lower than a predetermined judgment reference level, it is judged that the earth fault is generated, and then an alarm is outputted.

Further, in a Patent Literature 1, the earth fault detector 440 having a circuit configuration as shown in FIG. 14 is suggested. In the earth fault detector 440, a switching state of each of the measurement periods is the same as the earth fault detector 400.

Patent Literature 1: JP 2009-281986 A

SUMMARY OF THE INVENTION

In the conventional earth fault detector, the switching elements S1 to S4 are configured to have four optical MOS-FETs which are an insulating type switching elements. However, the optical MOS-FET is expansive, and thereby the cost of the earth fault detector is increased.

Thus, an object of the present invention is to suppress an increase in cost caused by a switching element in an earth fault detector using a flying capacitor.

In order to solve the above problem, an earth fault detector of the present invention is connected to a nonground high voltage battery and detects an earth fault of a system in which the high voltage battery is provided. The earth fault detector includes a controller; a detection capacitor operating as a flying capacitor; a positive side power line connected to a positive side of the high voltage battery; a negative side power line connected to a negative side of the high voltage battery; a positive second side resistance of which one end is grounded and a voltage of another end is measured by the controller; a negative second side resistance of which one end is grounded; a positive side C contact switch alternatively switching a connection destination of a first end of the detection capacitor to either a path including the positive side power line or a path including the positive second side resistance based on an instruction of the controller; and a negative side C contact switch alternatively switching a connection destination of a second end of the detection capacitor to either a path including the negative side power line or a path including the negative second side resistance based on the instruction of the controller. The controller controls switching of the positive side C contact switch and the negative side C contact switch by switching a first measurement mode and a second measurement mode. The first measurement mode may include measurement of voltage corresponding to the high voltage battery, measurement of voltage affected by a positive side insulation resistance, and measurement of voltage affected by a negative side insulation resistance in a measurement cycle, and the second measurement mode may omit any of the measurements.

Herein, the controller can move to the first measurement mode when a measured result of the voltage affected by the positive side insulation resistance or a measured result of the voltage affected by the negative side insulation resistance satisfies a predetermined condition.

Further, the controller may switch the first measurement mode and the second measurement mode according to an instruction from an external controller, and the second measurement mode further may include a measurement mode omitting all of the measurements.

Furthermore, the second measurement mode may omit the measurement of voltage corresponding to the high voltage battery, and include a measurement mode including the measurement of the voltage affected by the positive side insulation resistance and the measurement of the voltage affected by the negative side insulation resistance in a measurement cycle. The controller may move to the first measurement mode when in the measurement mode either a voltage value obtained from the measured result of the voltage affected by the positive side insulation resistance or a voltage value obtained from the measured result of the voltage affected by the negative side insulation resistance exceeds a predetermined threshold.

Meanwhile, the second measurement mode may omit the measurement of the voltage corresponding to the high voltage battery, and include a measurement mode including the measurement of the voltage affected by the positive side insulation resistance and the measurement of the voltage affected by the negative side insulation resistance in a measurement cycle. The controller may move to the first measurement mode when in the measurement mode either a change ratio of the voltage affected by the positive side insulation resistance or a change ratio of the voltage affected by the negative side insulation resistance satisfies a predetermined condition.

According to the present invention, in the earth fault detector using the flying capacitor, the optical MOS-FET due to cost increase is not used. Therefore, the cost increase caused by the switching element can be suppressed.

BRIEF DESCRIPTION OF THE DRAWINGS

FIGS. 10A and 10B are diagrams showing measurement paths of V0 measurement period;

DESCRIPTION OF THE PREFERRED EMBODIMENT

Figure 1:
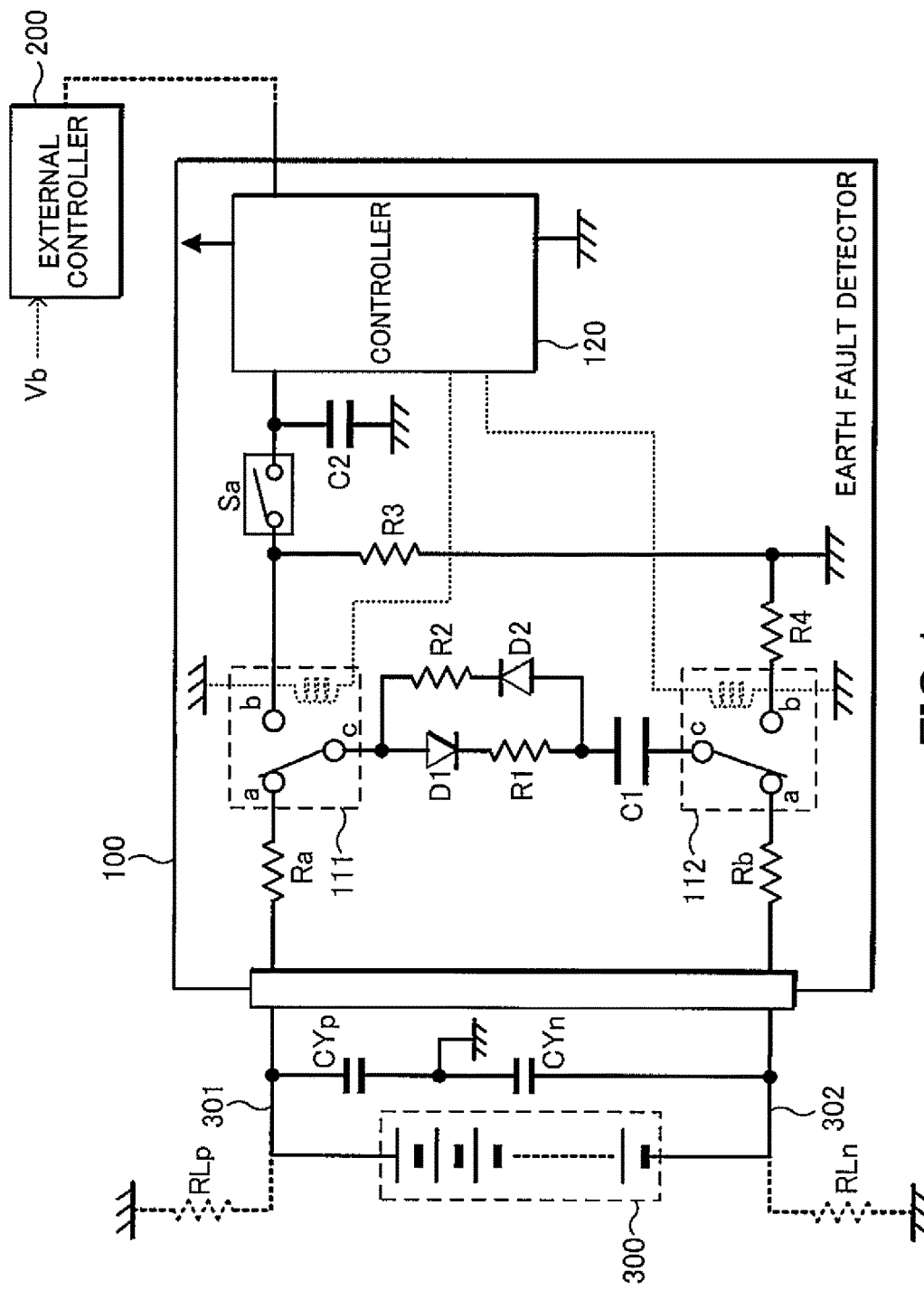
FIG. 1 is a block diagram showing a configuration of an earth fault detector according to an embodiment of the present invention.

An embodiment of the present invention will be explained with reference to drawings. FIG. 1 is a block diagram showing a configuration of an earth fault detector 100 according to the embodiment of the present invention. As shown in FIG. 1, the earth fault detector 100 is connected to an ungrounded high-voltage battery 300, and is a device of a flying capacitor type for detecting an earth fault of a system in which the high voltage battery 300 is provided. Herein, an insulation resistance arranged between a positive side of the high-voltage battery 300 and a ground is represented as RLp, and an insulation resistance arranged between a negative side thereof and the ground is represented as RLn. Also, the high voltage means a high voltage larger than a low voltage battery (In general, 12V) so as to drive various instruments (such as a lamp, wiper and so on) in a vehicle, and the high voltage battery 300 is a battery used for driving the vehicle so as to run it.

The high voltage battery 300 is constructed by a rechargeable battery such as a lithium ion battery, is discharged via a high voltage bus bar not shown, and drives an electric motor connected via an inverter or the like. Further, during regeneration or when charging equipment is connected, charging is performed via the high voltage bus bar.

Capacitors CYp and CYn referred as Y capacitor (line-bypass-capacitor) are connected between a positive side power line 301 of the high voltage battery 300 and a ground electrode, and between a negative side power line 302 and the ground electrode so as to remove high-frequency noise of power source or too stabilize the operation. Meanwhile, the Y capacitor may be omitted.

As shown in drawings, the earth fault detector 100 has a detection capacitor C1 operating as a flying capacitor, and a switching element Sa for sampling a measurement voltage corresponding to a charge voltage of the detection capacitor C1. Herein, the switching element Sa may be omitted. Further, the earth fault detector 100 has a controller 120 configured by a microcomputer. The controller 120 performs various controls required for the earth fault detector 100 such as a switch switching processing described later by implementing a pre-embedded program. The controller 120 communicates with an external controller 200 being a higher-level device so as to output a measured value obtained in the measurement period or earth fault detection result and to input operation instructions and so on.

Figure 12A:
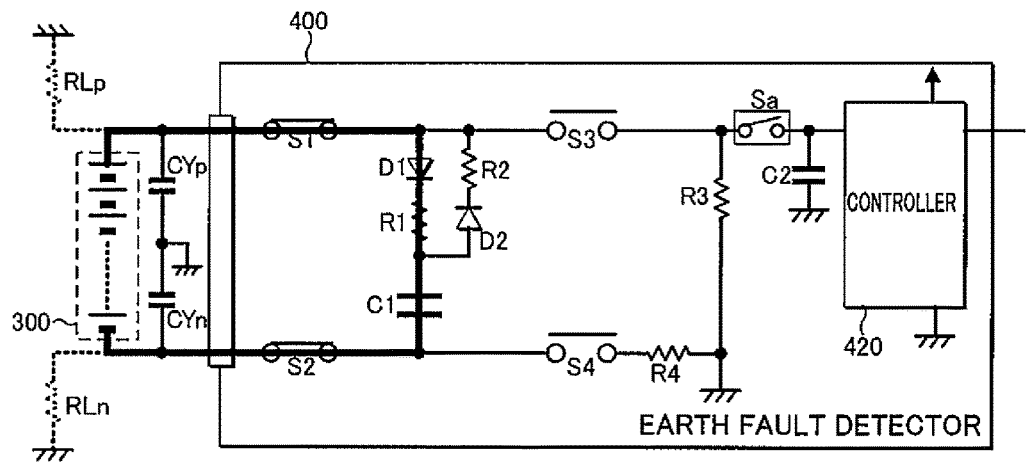
FIG. 12A to 12C are diagrams showing measurement paths of a V0 measurement period.
Figure 12B:
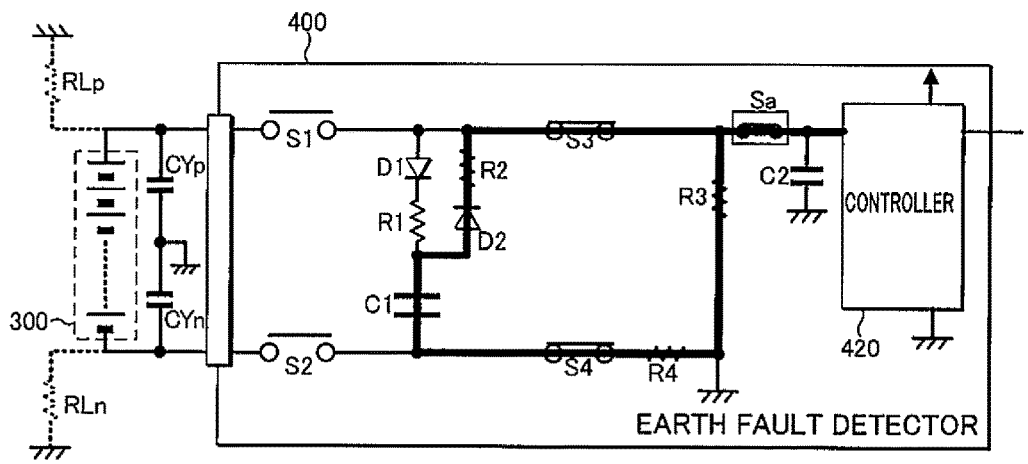
Figure 12C:
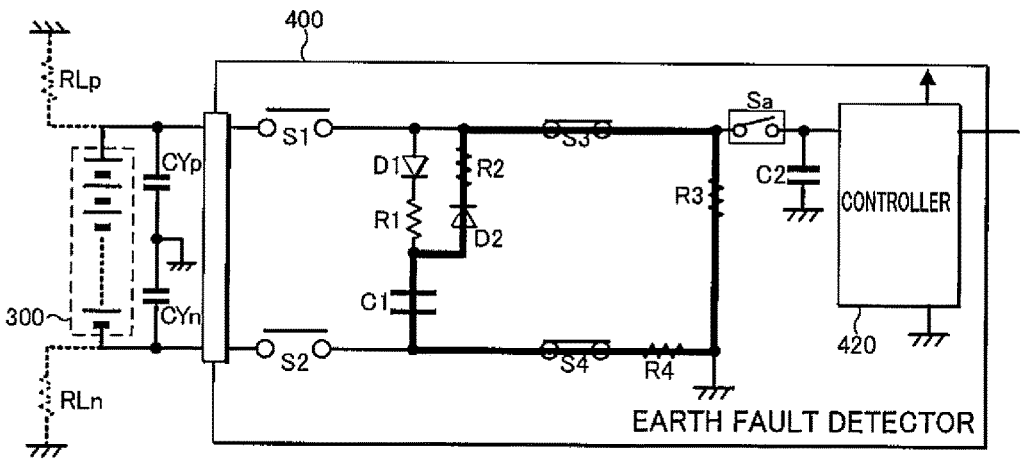
Figure 13A:
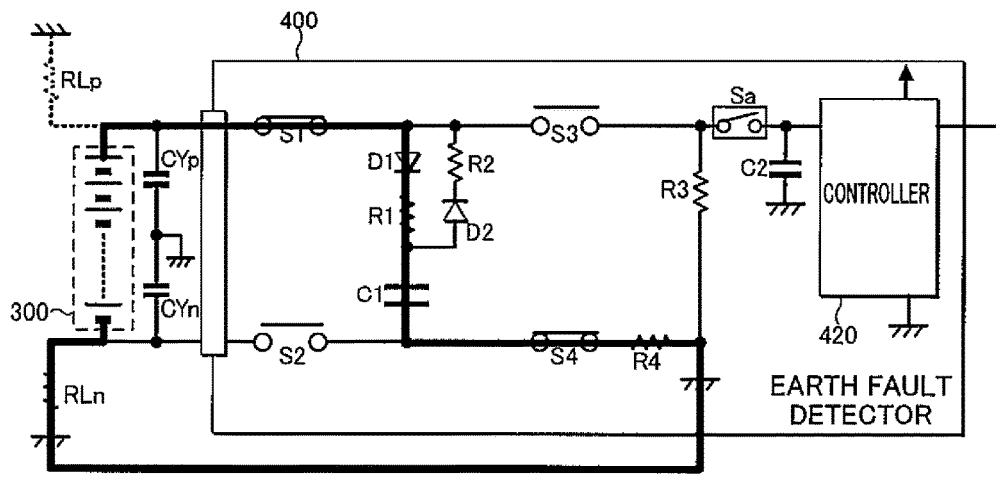
FIGS. 13A and 13B are diagrams showing measurement paths of a Vc1$n$ measurement period and a Vc1$p$ measurement period.
Figure 13B:
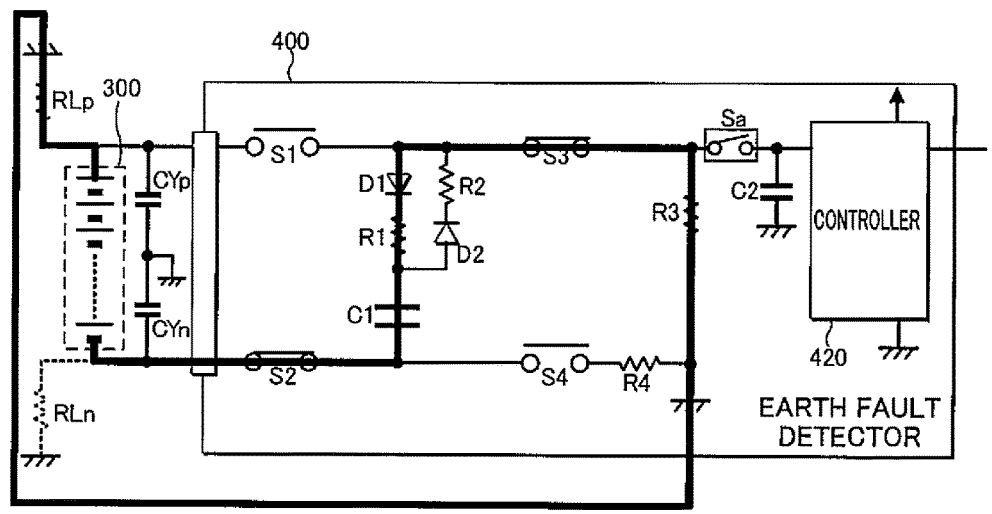
Figure 14:
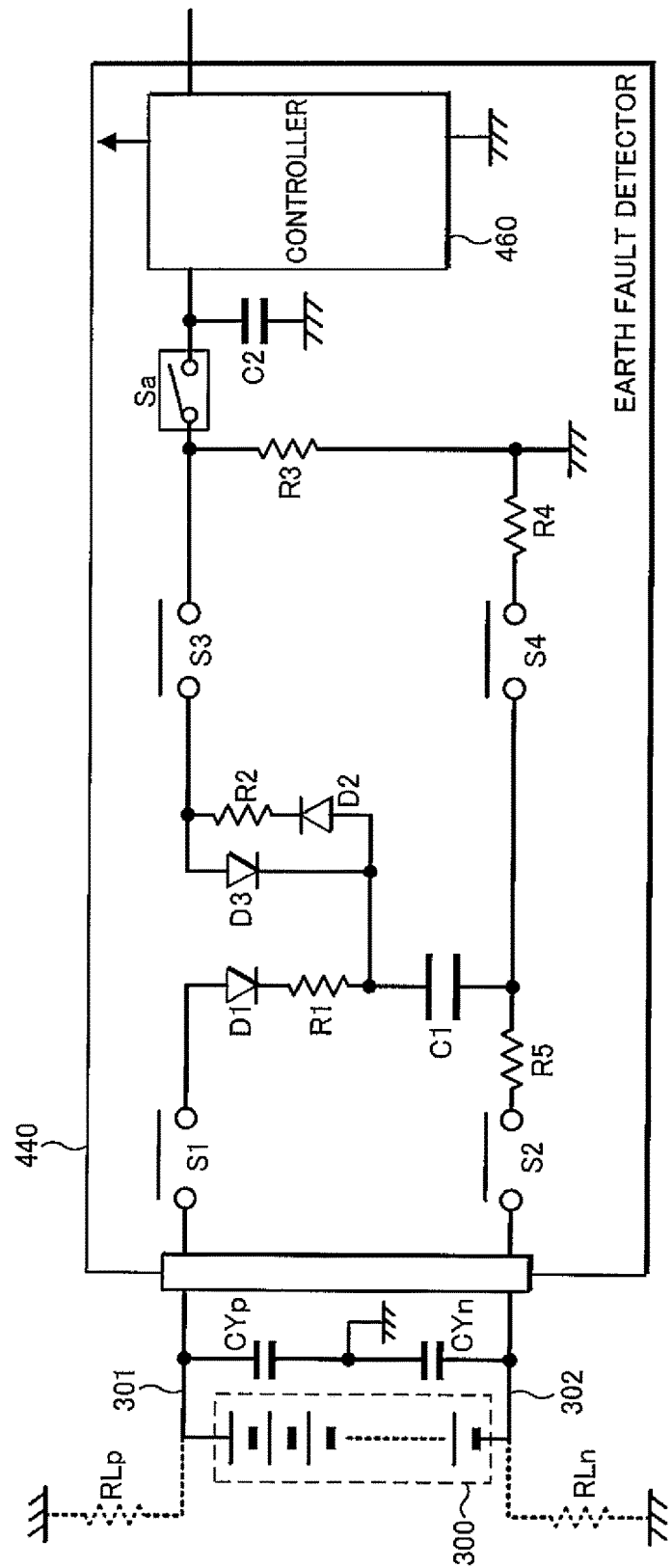
FIG. 14 is a diagram showing another example of the conventional earth fault detector of the flying capacitor tape.

As described with reference to FIGS. 12 and 13, in a measurement path of each of measurement periods, a switching element S1 and a switching element S3 in a positive side power line 301 system are not turned ON at the same time, and a switching element S2 and a switching element S4 in a negative side power line 302 system are not turned ON at the same time. In other words, the switching element S1 and the switching element S3 are exclusively switched, and the switching element S2 and the switching element S4 are exclusively switched.

For this reason, in the earth fault detector 100, a positive side C contact switch 111 is used as a switching element of the positive side power line 301 system, and a negative side C contact switch 112 is used as a switching element of the negative side power line 302 system. The positive side C contact switch 111 and the negative side C contact switch 112 may be constructed for example by mechanical relays having a high-withstanding pressure—small signal or reed relays.

Common contact points c in both the positive side C contact switch 111 and the negative side C contact switch 112 are arranged in a detection capacitor C1 side. More specifically, the common contact point c of the positive side C contact switch 111 is connected to one end of the detection capacitor C1 via a parallel circuit having a path of a diode D1 and a resistance R1 and a path of a resistance R2 and a diode D2. Further, the common contact point c of the negative side C contact switch 112 is connected to the other end of the detection capacitor C1. The diode D1 which becomes a path during charging is connected in a direction in which a path from the positive side C contact switch 111 to the detection capacitor C1 becomes a forward direction, and the diode D2 which becomes a path during discharging is connected in the opposite direction. The resistance R2 functions as a discharge resistor.

A contact a contact point a of the positive side C contact switch 111 is connected to the positive side power line 301 through the resistance Ra, and a contact point a of the negative side C contact switch 112 is connected to the positive side power line 301 through the resistance Rb. In other words, in both the positive side C contact switch 111 and the negative side C contact switch 112, the contact points a are positioned at a high voltage battery 300 side. However, the resistance Ra and the resistance Rb may be omitted.

A contact point b of the positive side C contact switch 111 is connected to the switching element Sa, and is connected to a resistance R3 of a positive second side resistance of which another end is grounded. A contact point b of the negative side C contact switch 112 is connected to a resistance R4 of a negative second side resistance of which another end is grounded. That is, in both the positive side C contact switch 111 and the negative side C contact switch 112, the contact portions b are positioned at a controller 120 side (ground side).

As shown in FIG. 1, the positive side C contact switch 111 and the negative side C contact switch 112 are independently switched and controlled by the controller 120. The controller 120 switches measurement paths by independently switching and controlling the positive side C contact switch 111, the negative side C contact switch 112, and the switching element Sa, and performs charging and discharging of the detection capacitor C1 and measure of charge voltage.

Figure 2A:
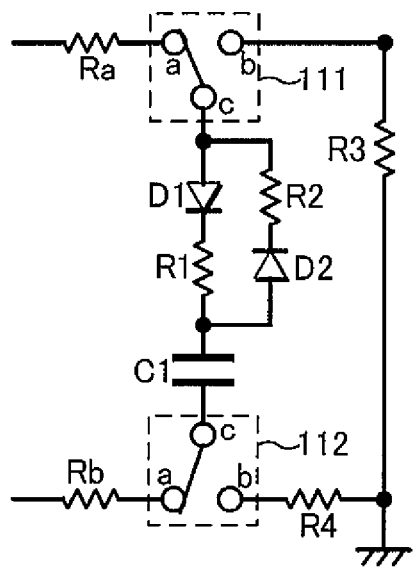
FIG. 2A to 2D are diagrams showing states of C contact point switch in each of measurement periods.

In particular, as shown in FIG. 2A, in the V0 measurement period, both the positive side C contact switch 111 and the negative side C contact switch 112 are switched to a contact point a side, and a measurement path of the high voltage battery 300 the resistance Ra, the resistance R1, the detection capacitor C1 and the resistance Rb is formed.

Figure 2B:
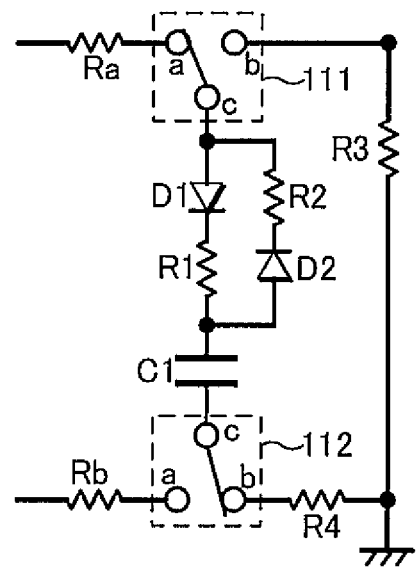
Figure 2C:
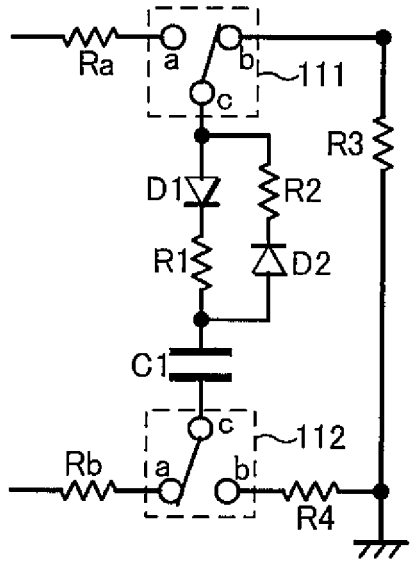
Figure 2D:
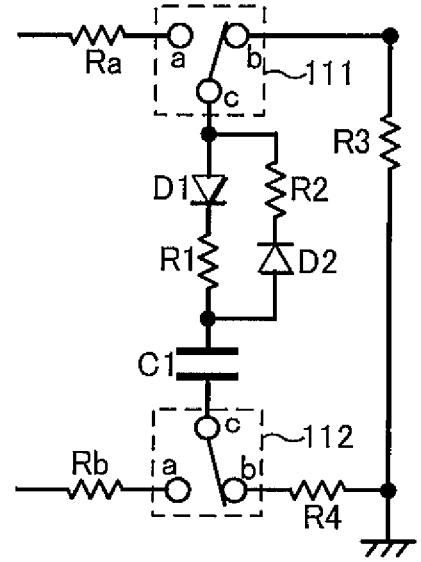
Figure 3:
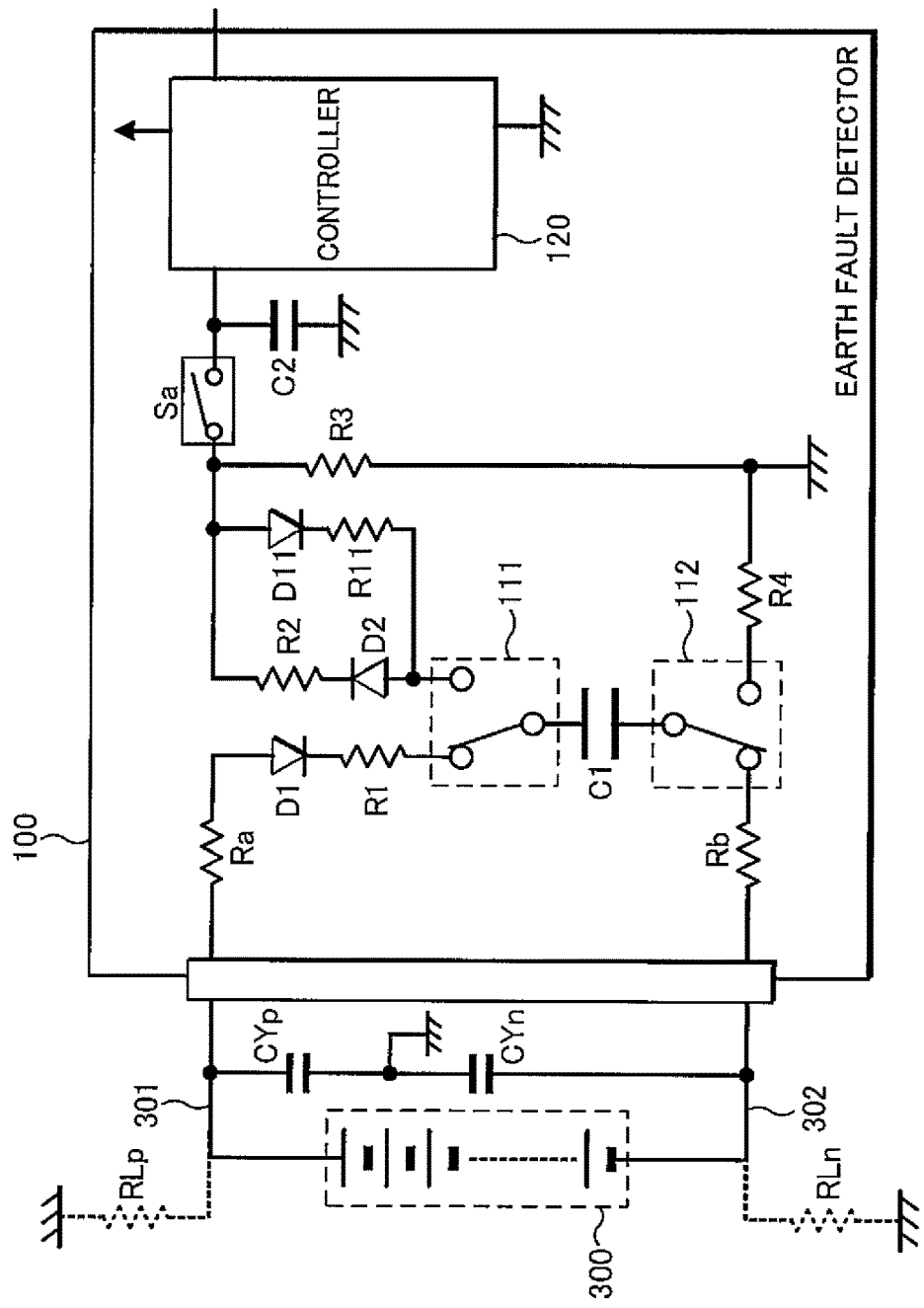
FIG. 3 is a diagram showing another example of arrangement place of a positive side C contact point switch.

As shown in FIG. 2D, when measuring the charge voltage of the detection capacitor C1, both the positive side C contact switch 111 and the negative side C contact switch 112 are switched to a contact portion b side, and the switching element Sa is turned ON. Thereafter, the switching element Sa is turned OFF, and for the next measurement, the detection capacitor C1 is mainly discharged by using the resistance R2. When measuring the charge voltage of the detection capacitor C1, the operation during discharging is the same in other measurement periods.

As shown in FIG. 2B, in the Vc1$n$ measurement period, the positive side C contact switch 111 is switched to the contact point a side, and the negative side C contact switch 112 is switched to the contact point b side. Further, a measurement path of the high voltage battery 300, the resistance Ra, the resistance R1, the detection capacitor C1, the resistance R4, the ground, and the insulation resistance RLn is formed.

Further, as shown in FIG. 2C, the positive side C contact switch 111 is switched to the contact point b side, and the negative side C contact switch 112 is switched to the contact point a side. Furthermore, a measurement path of the high voltage battery 300, the insulation resistance RLp, the ground, the resistance R1, the detection capacitor C1, and the resistance Rb is formed.

In the earth fault detector 100, the resistance Ra, the resistance Rb, and the resistance R1 are high resistances having for example several hundred kΩ, and the resistance R2, the resistance R3, and the resistance R4 are low resistances for example having several kΩ.

Separately from the resistance R1, the resistance Ra is arranged on the positive side, and the resistance Rb is arranged on the negative side. The positive side C contact switch 111 and the negative side C contact switch 112 are constructed by a C contact point relay. Therefore, even if fixing occurs with any of the C contact switches, either the resistance Ra of high resistance or the resistance Rb of high resistance is arranged between the high voltage battery 300 and the controller 120, and thereby current is restricted. For this reason, the controller 120 and an energizing circuit can be protected.

Furthermore, even if the contact point a and the contact point b are shorted out at either the positive side C point switch or the negative side C point switch, either the resistance Ra of high resistance or the resistance Rb of high resistance is arranged between the high voltage battery 300 and the controller 120, and thereby current is restricted. Therefore, the controller 120 can be protected.

Moreover, in a case that a reference value for determining earth fault in the insulation resistance RLp and the insulation resistance RLn is RLs, when the insulation resistance RLp and the insulation resistance RLn are the reference value PLs, each of the resistance value is defined with a relationship of R1+Ra+Rb=R1+R4+Ra+RLn=R1+R3+Rb+RLp so that the resistance values on the path become equal in the V0 measurement period, Vc1$n$ measurement period, and Vc1$p$ measurement period. Therefore, although a ceramic capacitor is used as the detection capacitor C1, it is possible to prevent the earth fault detection accuracy from decreasing due to the influence of DC bias characteristic.

In the positive side C contact switch 111 and the negative side C contact switch 112, one of the contact points a at the high voltage battery 300 side and the contact point b at the controller 120 side (ground side) can be appropriately set to a normal close side in consideration of the following characteristics.

1) When the contact points a at the high voltage battery 300 side in both the positive side C contact switch 111 and the negative side C contact switch 112 are set to the normally closed sides, the high voltage has already been charged to the detection capacitor C1 at the start of starting of the earth fault detector 100. Therefore, the charging process for the first V0 measurement period can be omitted. Thus, it is possible to respond to a functional need of quickening the earth fault judgment from the normal time in order to ensure safety at startup.

2) When the contact points b at the controller 120 side in both the positive side C contact switch 111 and the negative side C contact switch 112 are set to the normally closed sides, the detection capacitor C1 becomes a discharged state at the time of operation stop. Therefore, the risk of electric shock such as a removal of the earth fault detector 100 is reduced.

3) When either the positive side C contact switch 111 or the negative side C contact switch 112 is set to the normally closed side, voltage between one of the positive side C contact switch 111 and the negative side C contact switch 112 and the ground is charged to the detection capacitor C1 at the time of start. By measuring this voltage and comparing it with the normal state, a state that the insulation resistance of one of them is decreased can be simply and instantaneously understood.

As explained above, in the earth fault detector 100 of the embodiment in the present invention, an optical MOS-FET which causes cost increase is not used as a switch for switching the measurement path for detecting earth fault. Therefore, cost increase due to the switching element can be suppressed.

Further, the switching element used in the past with four switches is structured by two C contact point switches. Therefore, it is possible to reduce the number of components as well as to reduce the number of control lines as compared with the prior art.

Also, in the above example, the positive side C contact switch 111 is connected to the detection capacitor C1 via the parallel circuit including the path of the diode D1 and the resistance R1 and the path of the resistance R2 and the diode D2. However, as shown in FIG. 2, the common contact point c of the positive side C contact switch 111 may be directly connected to the detection capacitor C1. In this case, the contact point a is connected to the resistance Ra via the diode D1 and the resistance R1, and the contact point b is connected to the switching element Sa via the diode D2 and the resistance R2. A path of the diode D2 may be connected in parallel to a path of the diode D11 in a direction opposite to the diode D2 and the resistance R11.

Moreover, the C contact switches are structured by mechanical contact arrangement. For this reason, the number of open-close endurance is limited. Specially, as energizing current and applied voltage become large, influences on the number of open-close endurance becomes great. Thus, in order to increase the number of open-close endurance, the number of open-close may be reduced by performing control described below.

Figure 4A:
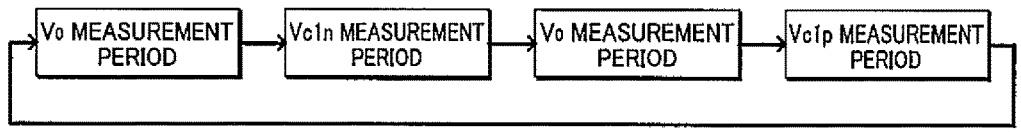
FIG. 4A to 4D are diagrams showing examples of measurement modes.

Conventionally, as shown in FIG. 4A, the measurement for detecting ground fault repeats measurement operation of the V0 measurement period→Vc1n measurement period→the V0 measurement period→the Vc1p measurement period as one cycle. The cycle is referred to as the measurement mode A. In this case, each of states shown in FIG. 2A to 2D is frequently switched. For this reason, the number of open-close of the C contact switches becomes large.

Figure 4B:
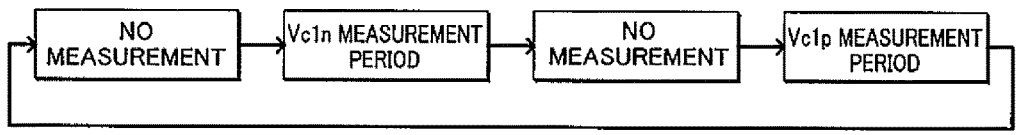
Figure 4C:
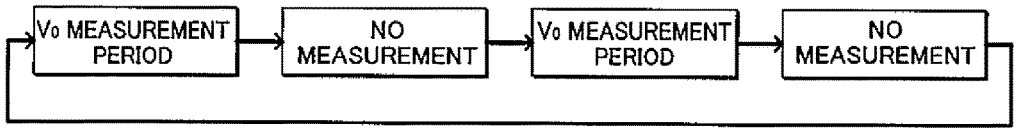
Figure 4D:
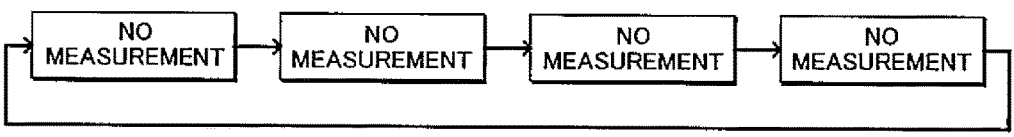

Thus, as shown in FIG. 4B to 4D, a measurement mode B eliminating the V0 measurement period, a measurement mod C eliminating the Vc1 measurement period, and a measurement mode D in which all of the measurements are not performed are provided, and those modes are appropriately switched so as to suppress the number of open-close of the C contact switches.

Herein, as shown in FIG. 2D, in the "No measurement" in each of measurement modes, a switch switching from the last measurement period is not required by switching the positive side C contact switch 111 and the negative side C contact switch 112 to the contact point b side. Therefore, as the period of the "No measurement" becomes large, the number of open-close of the C contact switch can be suppressed.

Also, the measurement modes provided are not limited to the measurement modes A to D. For example, all of the measurement periods may be V0 measurement period, and a measurement mode in which two V0 measurement periods of one cycle in the measurement mode A is one cycle may be provided.

Furthermore, a measurement mode combining multiple different measurement modes may be provided. For example, by providing a measurement mode multiple repeating the measurement mode D after the measurement mode A as one cycle, the determination of ground fault can be intermittently performed, and the switching of the C contact switch is not required during this period.

Figure 5:
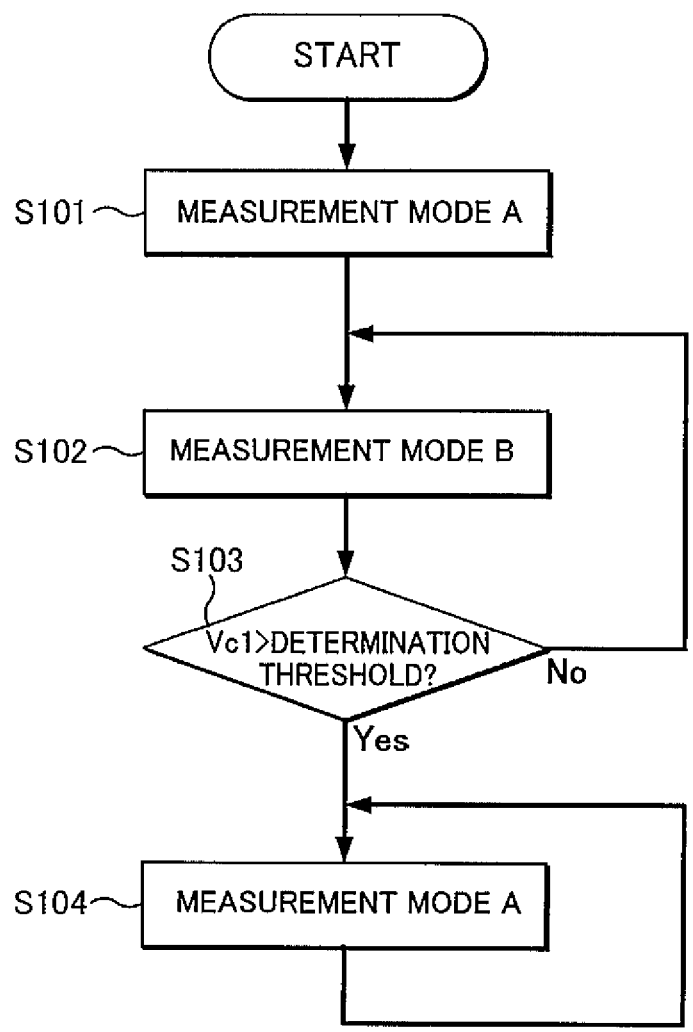
FIG. 5 is a flowchart for explaining switching determination of the measurement modes performed by the earth fault detector.

The switching determination of the measurement mode is performed for example by the earth fault detector 100 or the external controller 200. FIG. 5 is a flowchart showing a control example when the earth fault detector 100 performs measurement mode switching determination.

At the time of start-up, measurement operation in the measurement mode A is performed in order to correctly determine the ground fault (S101). Thereafter, it moves into the measurement operation in the measurement mode B in order to suppress the number of open-close of the C contact switch (S102). In the measurement mode B, only Vc1 measurement is performed. Therefore, current loads and voltage loads in the C contact switch can be reduced.

In the measurement operation of the measurement mode B, Vo measurement is not performed. Thus, the insulation resistance cannot be accurately measured, but a condition of the ground fault can be approximately recognized based on the measured values (referred to as a measured value Vc1) obtained in the Vc1n measurement period and the Vc1p measurement period. In other words, as the insulation resistances RLp and RLn becomes small, current flowing in a measuring circuit is increased. For this reason, the measured value Vc1 is increased than in a normal state.

Therefore, in a case that the measured value Vc1 is larger than a predetermined determination threshold (S103: Yes), the process is moved to the measurement mode A so as to correctly measure the insulation resistance (S104). After being moved to the measurement mode A, for example it may be returned to the measurement mode B if it is found that there is no abnormality by accurate measurement of the insulation resistance.

Figure 6:
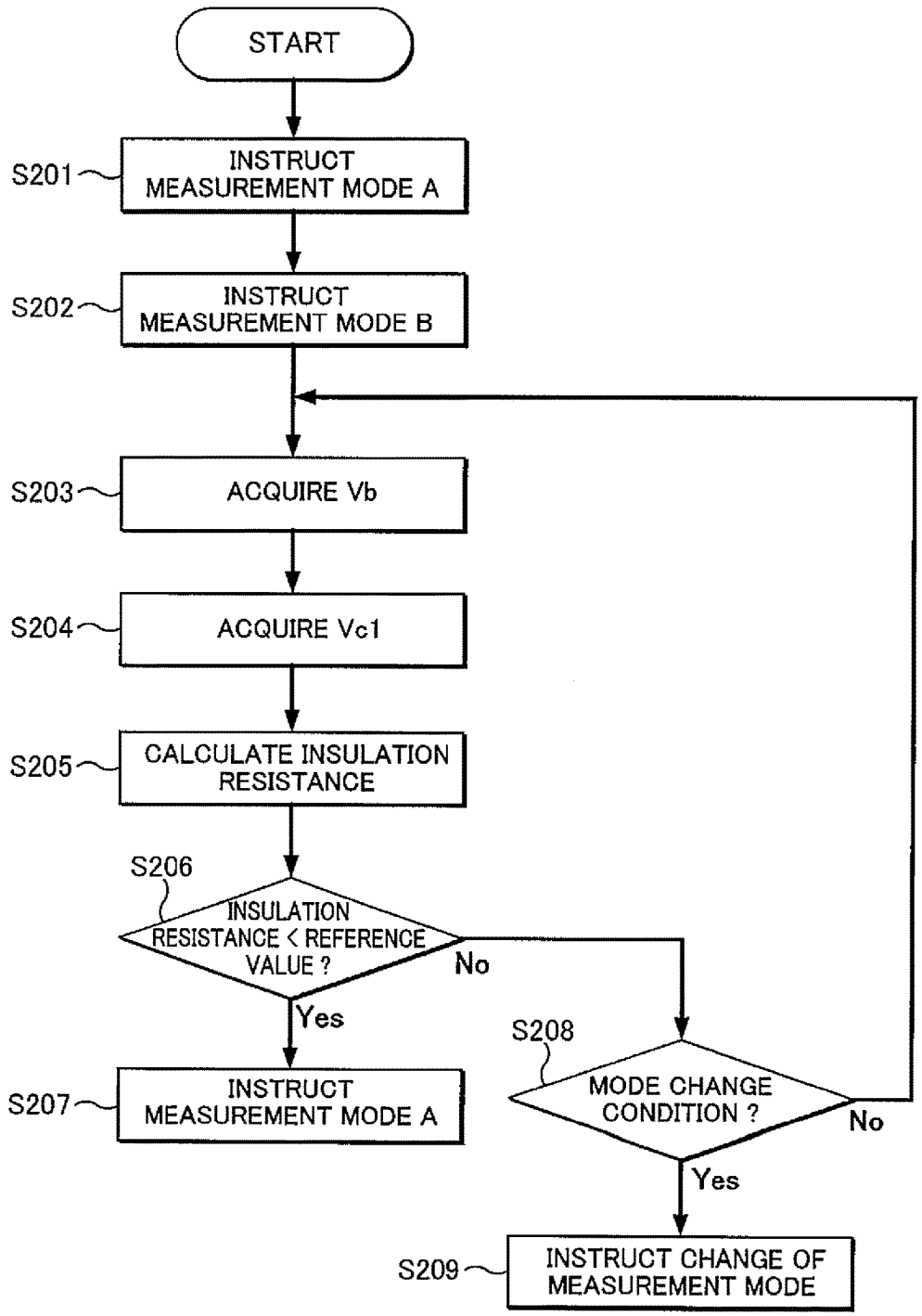
FIG. 6 is a flowchart for explaining switching determination of the measurement modes performed by external controller.

FIG. 6 is a flowchart showing a control example when the external controller 200 determines the measurement mode switching and instructs the measurement mode switching to the earth fault detector 100. Further, the external controller 200 can obtain a voltage Vb of the high-voltage battery 300 by the other measurement path separately from the V0 measurement of the earth fault detector 100.

At the time of startup, measurement operation of the measurement mode A is performed so as to determine earth fault accurately (S201). Thereafter, the process moves to measurement operation of the measurement mode B so as to suppress the number of open-close of the C contact switches (S202).

During measurement operation of the measurement mod B, voltage Vb of the high voltage battery is acquired from a measuring path separately from the earth fault detector 100 (S203), and voltage Vc1 which is a measurement result of the earth fault detector 100 is acquired (S204).

Further, insulation resistance is calculated based on the acquired voltage Vb and voltage Vc1 (S206). The voltage Vb and voltage Vc1 are different from each other in an acquisition path. For this reason, it is not always true that they are synchronized, and measurement conditions and the like are different. Therefore, the calculated insulation resistance is not always an accurate value.

Thus, when the insulation resistance is below a predetermined reference value (S206: Yes), measurement operation of the measurement mode A is performed so as to determine earth fault accurately (S207).

On the other hand, although the insulation resistance is not below the predetermined reference value (S206: No), in a case that a predetermined mode change condition is satisfied (S208: Yes), measurement mode may be changed by the earth fault detector 100 according to the condition (S209).

For example, when there is a necessary measuring value in operation, measurement mode capable of obtaining the measuring value can be performed by the external controller 200. Further, when the measuring value is not required, it can move to the measurement mode D in which open-close of the C contact switch is not necessary by the external controller.

The switching determination of the measurement mode may be performed by both the earth fault detector 100 and the external controller 200. In this case, for example, when instruction of switching of the measurement mode is received from the external controller 200 during determination of switching shown in FIG. 5 in the earth fault detector 100, the measurement mode is switched by prioritizing instruction from the external controller 200.

Next, another example of control explained with reference to FIG. 5 for determining switching from the measurement mode B in which the earth fault detector 100 does not perform the V0 measurement to the measurement mode A in which it performs the V0 measurement is determined will be explained. In the above processing (S103), when the measuring value Vc1 is larger than a predefined determination threshold, it moves to the measurement mode A.

Figure 7A:
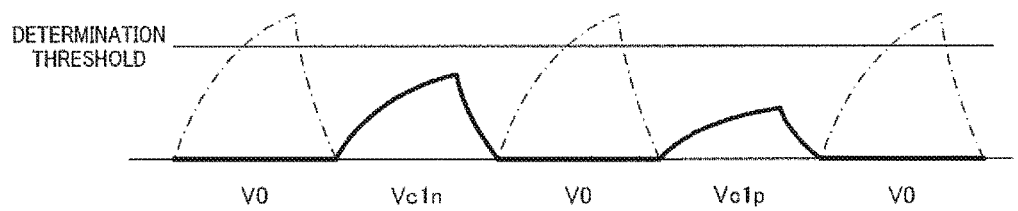
FIG. 7A to 7C are diagrams for explaining controls switching the measurement mode when a measurement value Vc1 is larger than a determination value.
Figure 7B:
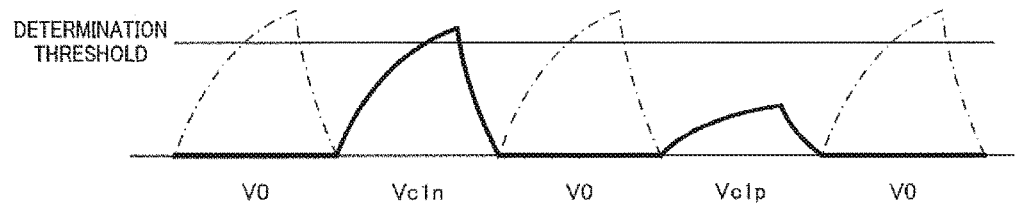

For example, as shown in FIG. 7A, when both Vc1n and Vc1p are not larger than the determination threshold, the measurement mode B is maintained. In the meantime, as shown in FIG. 7B, either Vc1n or Vc1p is larger than the determination threshold, it moves to the measurement mode A so as to measure insulation resistance accurately.

Figure 7C:
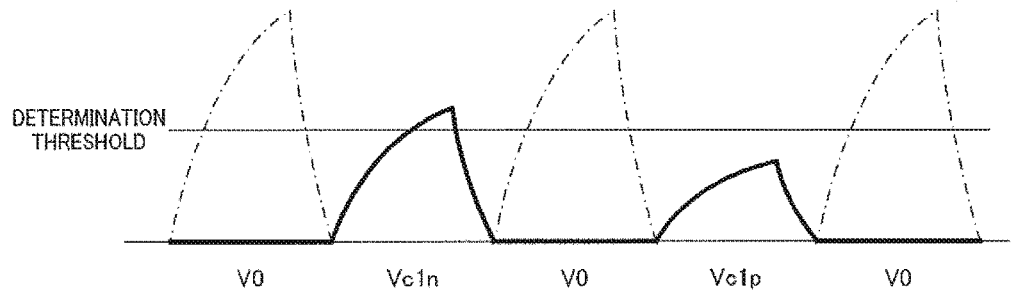

However, Vc1p and Vc1p are increased and decreased according to voltage variations of the high voltage battery 300. For this reason, when the voltage of the high voltage battery 300 is increased from any cause, as shown in FIG. 7C, Vc1n and Vc1p may exceed the determination threshold in some cases despite the insulation resistance not decreasing. Thereby, it moves to the measurement mode A unnecessarily, and the number of open-close is likely to be increased.

Therefore, in order to prevent transition to unnecessary measurement mode A, instead of determination whether or not the voltage values of Vc1n and Vc1p is larger than the determination threshold, as explained below, determination may be performed based on dimensions of change rate in a predetermined period of charge voltage of the detection capacitor C1.

In general, time change of charge voltage Vc of the capacitor C when voltage E is applied in a RC series circuit becomes $Vc=E(1-\exp(-t/RC))$.

When measuring Vc1 of the earth fault detector 100, E corresponds to voltage of the high voltage battery 300, C corresponds to capacity of the detection capacitor C1, and R corresponds to resultant value of measurement path resistance value of the earth fault detector 100 and insulation resistance value. Also, in order to simplify explanation, the effect of the Y capacitor is ignored.

Figure 8:
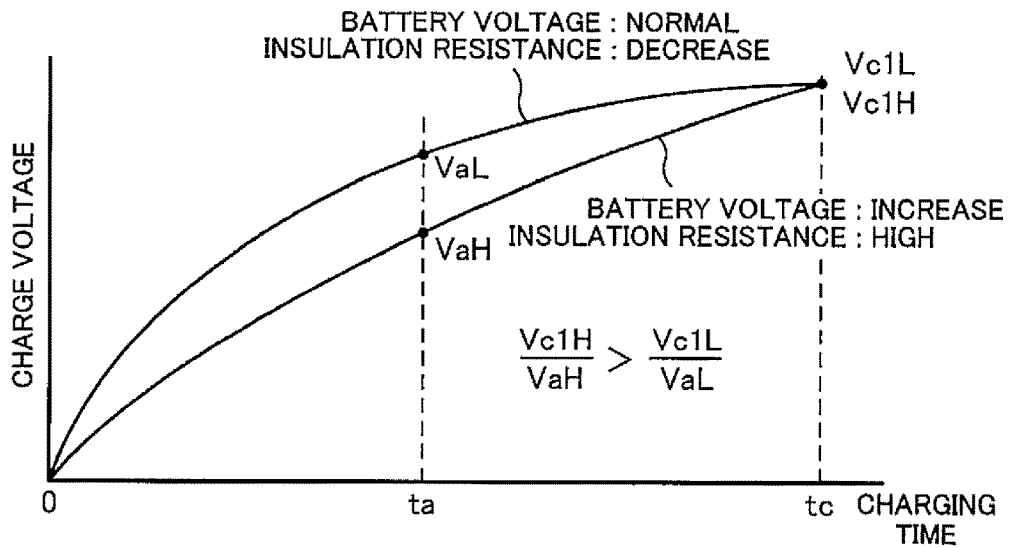
FIG. 8 is a diagram for explaining time variation at the rise of a charge voltage of a capacitor C.

As shown in FIG. 8, by the above formula, time change at the rise of charge voltage of the capacitor C differs between a case that Vc1 measuring value becomes high since voltage of the high voltage battery 300 is increased despite high insulation resistance and normal and a case that Vc1 measuring value become high since voltage of the high voltage battery 300 is normal and the insulation resistance is decreased even if Vc1 measuring values are equal.

In particular, when the insulation resistance is decreased, a rising curve becomes precipitous. Therefore, charge voltage when insulation resistance is low in charging time tc of Vc1 becomes Vc1L, charge voltage when insulation resistance is high becomes Vc1H, charge voltage when insulating resistance is low becomes Va1 in time to shorter than tc, and charge voltage when insulation resistance is high becomes VaH. As a result, (Vc1H/VaH)>(Vc1L/Va1) is established.

The Vc1/Va value is not influenced by voltage of the high voltage battery 300, and depends on the insulation resistance. For this reason, determination of transition to the measurement mode A is able to be performed based on Vc1/Va being a ratio between charge voltage Vc1 in time tc and charge voltage Va in time ta. In other words, when Vc1/Va is smaller than a predetermined determination ratio, transition to the measurement mode A can be decided since there is a possibility that the insulation resistance has decreased. Of course, determination may be performed based on the reciprocal of Va/Vc1.

Herein, measurement of Va may be performed independently from measurement of Vc1, and Va may be measured during measurement of Vc1. In the latter case, after a lapse of time ta from stating measurement of Vc1, a path for measuring Vc1 is once switched to a path for measuring Va, and then Va is measured. Thereafter, the path for measuring Va is again switched to the path for measuring Vc1, and it is sufficient to secure the remaining time of charging time tc. Hereinafter, an example that measurement of Va is performed separately from measurement of Vc1 will be explained.

Figure 9:
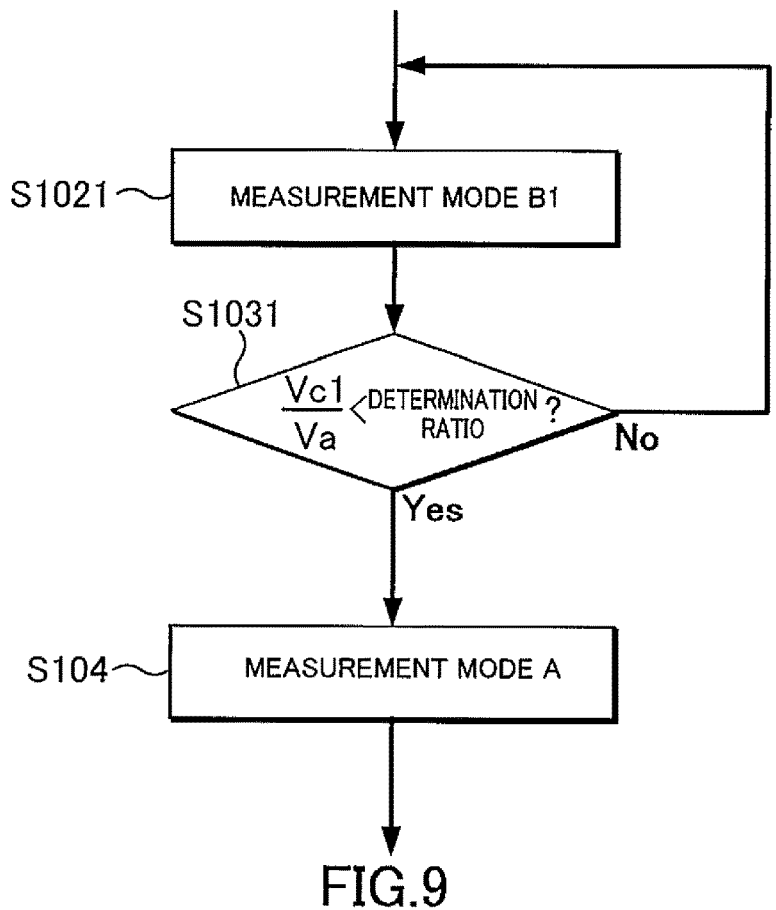
FIG. 9 is a flowchart for explaining operation when performing the determination based on the magnitude of change rage of the charge voltage.
Figure 11:
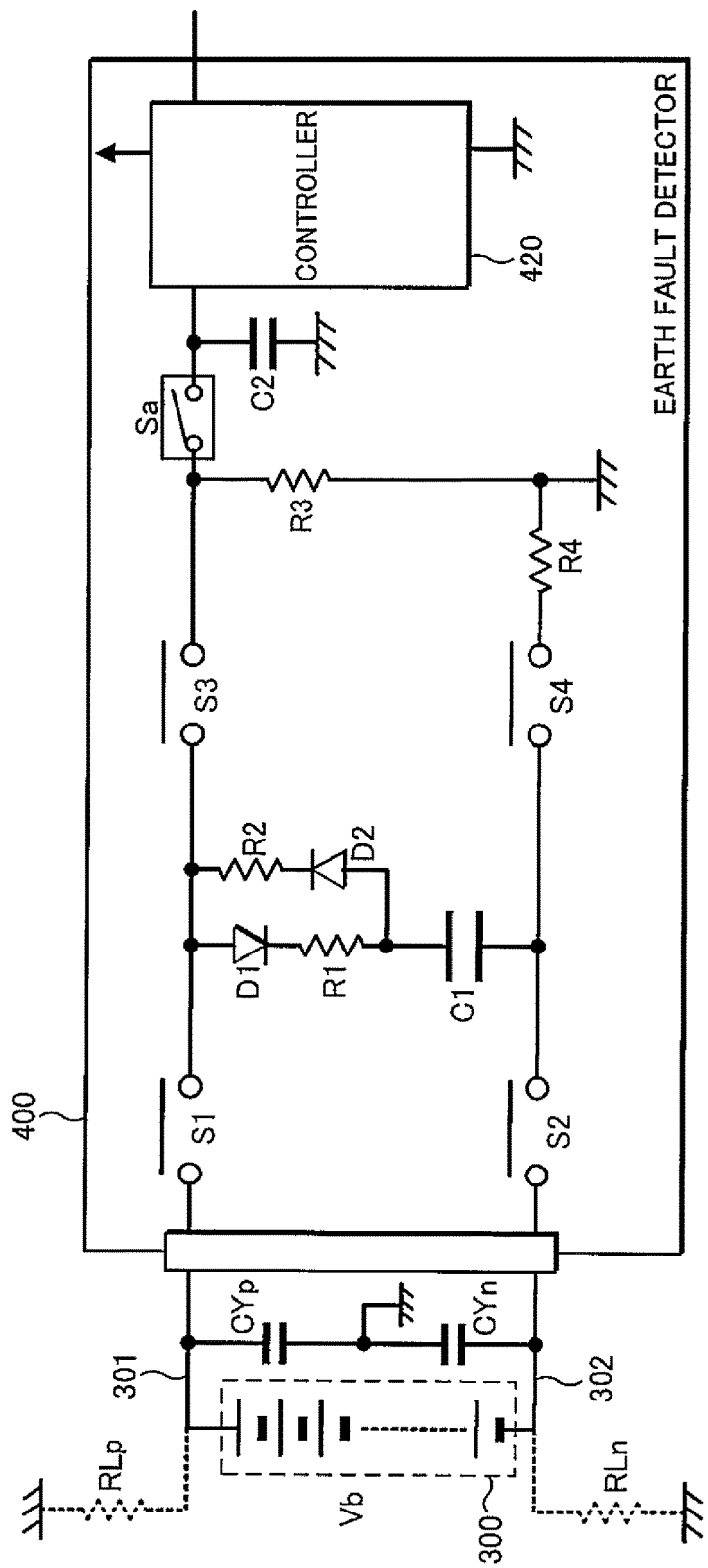
FIG. 11 is a diagram showing a circuit example of a conventional earth fault detector of a flying capacitor type.

FIG. 9 is a flowchart for explaining operation in case of determination based on dimensions of change ratio of charge voltage. In the flowchart shown in FIG. 5, instead of processing (S102), processing (S1021) is performed. Further, instead of processing (S103), processing (S1031) is performed.

In this operation, instead of the measurement mode B, a measurement mode B1 adding measurement of Va is performed (S1021). In the measurement mode B1, V0 measurement is not performed, and Vna corresponding to Va in Vc1n and Vpa corresponding to Va in Vc1p are measured.

As shown in FIG. 10A, for example, the measurement mode B1 may set Vna measurement period, Vc1n measurement period, Vpa measurement period, and Vc1p measurement period as one cycle. Further, as shown in FIG. 10B, the measurement mode B1 may set Vna measurement period, Vpa measurement period, Vc1n measurement period, and Vc1p measurement period as one cycle.

Also, when each of measuring values is obtained in the measurement mode B1, Vc1n/Vna and Vc1p/Vpa are respectively calculated. When at least one of them is smaller than the predetermined determination ratio (S1031: Yes), process moves to the measurement mode A so as to measure the insulation resistance accurately (S104).

Thereby, transition determination to the measurement mode A is unaffected by voltage variations of the high voltage battery 300. Therefore, the present invention can prevent an increase in the number of open-close of the C contact switch due to unnecessary transition to the measurement mode A.

The invention claimed is:

1. An earth fault detector connected to a non-ground high voltage battery and detecting the earth fault of a system in which the high voltage battery is provided, the earth fault detector comprising:
    a controller;
    a detection capacitor operating as a flying capacitor;
    a positive side power line connected to a positive side of the high voltage battery;
    a negative side power line connected to a negative side of the high voltage battery;
    a positive second side resistance of which one end is grounded and a voltage of another end is measured by the controller;
    a negative second side resistance of which one end is grounded;
    a positive side C contact switch alternatively switching a connection destination of a first end of the detection capacitor to either a path including the positive side power line or a path including the positive second side resistance based on an instruction of the controller; and
    a negative side C contact switch alternatively switching a connection destination of a second end of the detection capacitor to either a path including the negative side power line or a path including the negative second side resistance based on the instruction of the controller,
    wherein the controller controls switching of the positive side C contact switch and the negative side C contact switch by switching a first measurement mode and a second measurement mode, the first measurement mode including measurement of voltage corresponding to the high voltage battery, measurement of voltage affected by a positive side insulation resistance, and measurement of voltage affected by a negative side insulation resistance in a measurement cycle, and the second measurement mode omitting any of the measurements.

2. The earth fault detector according to claim 1, wherein the controller moves to the first measurement mode when a measured result of the voltage affected by the positive side insulation resistance or a measured result of the voltage affected by the negative side insulation resistance satisfies a predetermined condition.

3. The earth fault detector according to claim 1, wherein the controller switches the first measurement mode and the second measurement mode according to an instruction from an external controller, and
    the second measurement mode further includes a measurement mode omitting all of the measurements.

4. The earth fault detector according to claim 1, wherein the second measurement mode omits the measurement of voltage corresponding to the high voltage battery, and includes a measurement mode including the measurement of the voltage affected by the positive side insulation resistance and the measurement of the voltage affected by the negative side insulation resistance in a measurement cycle, and
    wherein the controller moves to the first measurement mode when in the measurement mode either a voltage value obtained from the measured result of the voltage affected by the positive side insulation resistance or a voltage value obtained from the measured result of the voltage affected by the negative side insulation resistance exceeds a predetermined threshold.

5. The earth fault detector according to claim 1, wherein the second measurement mode omits the measurement of the voltage corresponding to the high voltage battery, and includes a measurement mode including the measurement of the voltage affected by the positive side insulation resistance and the measurement of the voltage affected by the negative side insulation resistance in a measurement cycle, and
    wherein the controller moves to the first measurement mode when in the measurement mode either a change ratio of the voltage affected by the positive side insulation resistance or a change ratio of the voltage affected by the negative side insulation resistance satisfies a predetermined condition.

6. The earth fault detector according to claim 2, wherein the controller switches the first measurement mode and the second measurement mode according to an instruction from an external controller, and
    the second measurement mode further includes a measurement mode omitting all of the measurements.

* * * * *